US005633938A

United States Patent [19]
Porter, III

[11] Patent Number: 5,633,938
[45] Date of Patent: May 27, 1997

[54] AUDIO TRACK MIXING PROCESSOR

[76] Inventor: Frederick E. Porter, III, 12 W. Sahuaro Vista, Tucson, Ariz. 85704

[21] Appl. No.: 310,308

[22] Filed: Sep. 22, 1994

[51] Int. Cl.$^6$ .................................................. H03G 5/00
[52] U.S. Cl. .............................. 381/98; 381/1; 381/103
[58] Field of Search ................................. 381/1, 98, 103

[56] References Cited

U.S. PATENT DOCUMENTS 4,841,572  6/1989  Klayman ..................................... 381/1

FOREIGN PATENT DOCUMENTS 2086199  5/1982  United Kingdom ....................... 381/1

*Primary Examiner*—Curtis Kuntz
*Assistant Examiner*—Minsun Oh

[57] ABSTRACT

An audio track mixing processor comprising phonic conversion circuitry for receiving a primary audio track of an input audio mix in stereo and transmitting a detector activation signal in mono; a plurality of root mean square detectors tuned to consecutive midrange frequencies and each receiving the detector activation signal and each transmitting a gain control signal based upon the detector activation signal; a plurality of gain reduction amplifiers each tuned to the same consecutive midrange frequencies as the root mean square detectors and each receiving the secondary audio track of an input audio mix and the gain control signal, and each transmitting a first modified secondary audio track based upon the gain control signal; a bypass filter for receiving the secondary audio track of an input audio mix and transmitting a second modified secondary audio track; and summation circuitry for receiving a primary audio track and the first and second modified secondary audio tracks and transmitting a summed result thereof as an output audio mix.

8 Claims, 3 Drawing Sheets

AUDIO TRACK MIXING PROCESSOR

BACKGROUND OF THE INVENTION

1. Field of the Invention

The present invention relates to an audio track mixing processor and more particularly pertains to creating a spectral diminution of a plurality of audio tracks in an input audio mix with respect to a selected audio track of the input audio mix with an audio track mixing processor.

2. Description of the Prior Art

The use of sound processors is known in the prior art. More specifically, sound processors heretofore devised and utilized for the purpose of controlling selected frequencies of audible sounds are known to consist basically of familiar, expected and obvious structural configurations, notwithstanding the myriad of designs encompassed by the crowded prior art which have been developed for the fulfillment of countless objectives and requirements.

By way of example, U.S. Pat. No. 5,060,273 to Olah et al. discloses a sound mixing processor and method and system. U.S. Pat. No. 5,177,801 to Shoda et al. discloses a cross fader for editing audio signals. U.S. Pat. No. 5,237,619 to Frassinetti discloses a sound mixer with band separation. U.S. Pat. No. 5,204,908 to Sims discloses a sound system with rate controlled variable attenuation.

While these devices fulfill their respective, particular objective and requirements, the aforementioned patents do not describe an audio track mixing processor that allows a selected audio track to be predominant over the remaining audio tracks in an audio mix.

In this respect, the audio track mixing processor according to the present invention substantially departs from the conventional concepts and designs of the prior art, and in doing so provides an apparatus primarily developed for the purpose of creating a spectral diminution of a plurality of audio tracks in an input audio mix with respect to a selected audio track of the input audio mix.

Therefore, it can be appreciated that there exists a continuing need for new and improved audio track mixing processor which can be used for creating a spectral diminution of a plurality of audio tracks in an input audio mix with respect to a selected audio track of the input audio mix. In this regard, the present invention substantially fulfills this need.

SUMMARY OF THE INVENTION

In the view of the foregoing disadvantages inherent in the known types of sound processors now present in the prior art, the present invention provides an improved audio track mixing processor. As such, the general purpose of the present invention, which will be described subsequently in greater detail, is to provide a new and improved audio track mixing processor and method which has all the advantages of the prior art and none of the disadvantages.

The present invention is used for creating a spectral diminution of a plurality of audio tracks in an input audio mix with respect to a selected audio track of the input audio mix, wherein the selected audio track within the input audio mix is designated as the primary audio track and the remaining audio tracks within the input audio mix are designated as a secondary audio track and wherein each audio track is formed of relative high frequency and mid-frequency and low frequency signals. To attain this, the present invention essentially comprises, in combination, phonic conversion circuitry having a primary stereo input pair and a mono output port with the primary stereo pair including a left primary input and a right primary input for receiving a primary audio track in stereo and with the output port transmitting a detector activation signal in mono. A plurality of root mean square detectors are included. Each root mean square detector is tuned to a different mid-frequency band of a plurality of consecutive mid-frequency bands. Each root mean square detector has an input port and an output port. Each input port of a root mean square detector is coupled to the output port of the phonic conversion circuitry for receiving the detector activation signal therefrom. Each output port of a root mean square detector transmits a gain control signal at a value proportional to the root mean square value within its bandpass of the detector activation signal received at its input port. A plurality of gain reduction amplifiers are included and formed with bandpass filters tuned to the plurality of consecutive mid-frequency bands. Each gain reduction amplifier is tuned to a different mid-frequency band of the plurality of consecutive mid-frequency bands. Each gain reduction amplifier is associated with one of the plurality of root mean square detectors and is tuned to the same mid-frequency band. Each gain reduction amplifier has a secondary stereo input pair, an input port, and an output pair. The secondary stereo input pair of each gain reduction amplifier includes a left secondary input and a right secondary input for receiving a secondary audio track in stereo. The input port of each gain reduction amplifier is coupled to the output port of an associated root mean square detector for receiving the gain control signal therefrom. The output pair of each gain reduction amplifier transmits a secondary audio track with its mid-frequency signals modified by a gain that is based upon the value of the gain control signal received at the input port to thereby define a first modified secondary audio track. A bypass filter is included and formed of a stop band filter. The bypass filter has a secondary stereo input pair and an output pair with the secondary stereo input pair including a left secondary input and a right secondary input for receiving a secondary audio track and with the output pair transmitting a secondary audio track containing only extreme high frequency and low frequency signals to thereby define a second modified secondary audio track. Lastly, summation circuitry is included and has an input pair and a stereo output pair with the input pair coupled with the primary stereo input pair for receiving a primary audio track therefrom, coupled to the output pairs of the gain reduction amplifiers for receiving the plurality of first modified secondary audio tracks therefrom, and coupled to the output pair of the bypass filter for receiving the second modified secondary audio track therefrom, and with the stereo output pair transmitting a summed result of the primary audio track, the first modified secondary audio tracks, and the second modified secondary audio track to thereby define an output audio mix having a primary audio track and a secondary audio track wherein the secondary audio track of the output audio mix is dependent on the primary audio track thereof.

There has thus been outlined, rather broadly, the more important features of the invention in order that the detailed description thereof that follows may be better understood, and in order that the present contribution to the art may be better appreciated. There are, of course, additional features of the invention that will be described hereinafter and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

Further, the purpose of the foregoing abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

It is therefore an object of the present invention to provide a new and improved audio track mixing processor which has all the advantages of the prior art sound processors and none of the disadvantages.

It is another object of the present invention to provide a new and improved audio track mixing processor which may be easily and efficiently manufactured and marketed.

It is a further object of the present invention to provide a new and improved audio track mixing processor which is of durable and reliable construction.

An even further object of the present invention is to provide a new and improved audio track mixing processor which is susceptible of a low cost of manufacture with regard to both materials and labor, and which accordingly is then susceptible of low prices of sale to the consuming public, thereby making such an audio track mixing processor economically available to the buying public.

Still yet another object of the present invention is to provide a new and improved audio track mixing processor which provides in the apparatuses and methods of the prior art some of the advantages thereof, while simultaneously overcoming some of the disadvantages normally associated therewith.

Even still another object of the present invention is to provide a new and improved audio track mixing processor for creating a spectral diminution of a plurality of audio tracks in an input audio mix with respect to a selected audio track of the input audio mix.

Lastly, it is an object of the present invention to provide a new and improved audio track mixing processor comprising phonic conversion circuitry for receiving a primary audio track in stereo and transmitting a detector activation signal in mono; a plurality of root mean square detectors each receiving the detector activation signal and each transmitting a gain control signal based upon the detector activation signal; a plurality of gain reduction amplifiers each associated with a root mean square detector, each receiving a secondary audio track and the gain control signal, and each transmitting a first modified secondary audio track with modified mid-frequency signals based upon the gain control signal; a bypass filter for receiving a secondary audio track and transmitting a second modified secondary audio track containing only high frequency and low frequency signals; and summation circuitry for receiving a primary audio track, the first modified secondary audio tracks and the second modified secondary audio track and transmitting a summed result thereof as an output audio mix.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be had to the accompanying drawings and descriptive matter in which there is illustrated preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein.

The same reference numerals refer to the same parts through the various Figures.

DESCRIPTION OF THE PREFERRED EMBODIMENT

Figure 1:
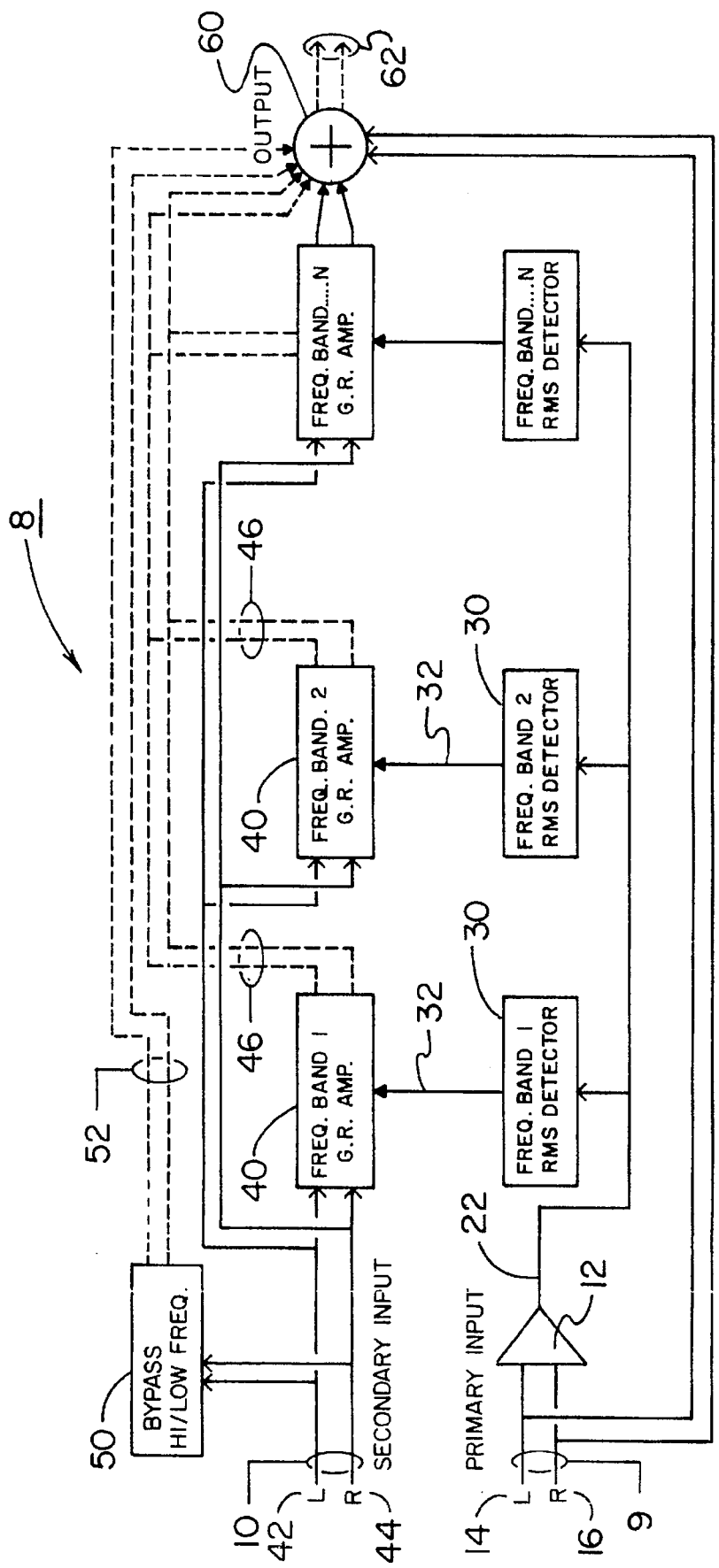
FIG. 1 is a functional block diagram of the preferred embodiment constructed in accordance with the principles of the present invention.

With reference now to the drawings, and in particular, to FIG. 1 thereof, the preferred embodiment of the new and improved audio track mixing processor embodying the principles and concepts of the present invention and generally designated by the reference number 8 will be described.

Specifically, the present invention essentially includes five major components. The major components are the phonic conversion circuitry, tuned root mean square detectors, tuned gain reduction amplifiers, bypass filter, and summation circuitry. These components are interrelated for allowing the creation of a spectral diminution of a plurality of audio tracks in an input audio mix with respect to a selected audio track of the input audio mix. For purposes of this description, the selected audio track within the input audio mix is designated as the primary audio track 9 and the remaining audio tracks within the input audio mix are designated as a secondary audio track 10. Each audio track is formed of a relative high frequency and mid-frequency and low frequency signals.

The first major component is the phonic conversion circuitry 12. The phonic conversion circuitry has a primary stereo input pair and a mono output port. The primary stereo pair includes a left primary input 14 and a right primary input 16 for receiving a primary audio track 9 in stereo of an input audio mix. The output port of the phonic conversion circuitry is used for transmitting a detector activation signal 22 in mono.

The second major component is the root mean square detectors 30. The present invention includes a plurality of root mean square detectors. Each root mean square detector is tuned to a different mid-frequency band of a plurality of consecutive mid-frequency bands. Each root mean square detector has an input port and an output port. Each input port is coupled to the output port of the phonic conversion circuitry for receiving the detector activation signal 22 therefrom. Each output port transmits a gain control signal 32 at a value proportional to the root mean square value within its bandpass of the detector activation signal received at its input port.

The third major component is the gain reduction amplifiers 40. The present invention includes a plurality of gain reduction amplifiers. The gain reduction amplifiers are formed with bandpass filters tuned to the plurality of consecutive mid-frequency bands identified with the root mean square detectors. Each gain reduction amplifier is tuned to a different mid-frequency band of the plurality of consecutive mid-frequency bands. Each gain reduction amplifier is associated with one of the plurality of root mean square detectors, and this associated root mean square detector is tuned to the same mid-frequency band. Each gain reduction amplifier has a secondary stereo input pair, an input port, and an output pair. Each secondary stereo input pair includes a left secondary input 42 and a right secondary input 44 for receiving a secondary audio track 10 in stereo of an audio mix. Each input port is coupled to the output port of the associated root mean square detector for receiving the gain control signal 32 therefrom. Each output pair transmits a secondary audio track with its mid-frequency signals modified by a gain that is based upon the value of the gain control signal 32 received at the input port to thereby define a first modified secondary audio track 46.

The fourth major component is the bypass filter 50. The bypass filter is formed of a stop band filter. The bypass filter has a bypass secondary stereo input pair and a bypass secondary stereo output pair. The bypass secondary stereo input pair includes a left bypass secondary input 42a and a right bypass secondary input 44a for receiving a secondary audio track 10 in stereo of an audio mix. The output pair transmits a secondary audio track containing only extreme high frequency and low frequency signals not transmitted by the gain reduction amplifiers to thereby define a second modified secondary audio track 52.

The fifth major component is the summation circuitry 60. The summation circuitry has an input pair and a stereo output pair. The input pair is coupled with the primary stereo input pair for receiving the primary audio track 18 therefrom. The summation circuitry is also coupled to the output pairs of the gain reduction amplifiers for receiving the plurality of first modified secondary audio tracks 46 therefrom. Furthermore, the summation circuitry is coupled to the output pair of the bypass filter 50 for receiving the second modified secondary audio track 52 therefrom. The stereo output pair of the summation circuitry transmits a summed result of the primary audio track, the first modified secondary audio tracks, and the second modified secondary audio track to thereby define an output audio mix 62 having a primary audio track and a secondary audio track. In this output audio mix, the secondary audio track thereof is dependent on the primary audio track.

Many different schemes have been developed over the years with the goal of keeping a vocal or audio track clear and intelligible in an audio mix while attempting the retain the level and impact of all other audio tracks. Delays, exciters, choruses, limiter/compressor/duckers, etc. have all been used to some degree in trying to bring the vocal (or any audio track of interest) "out of the mud." All of these devices either change the quality of the audio track(s), or create side effects such as pumping effects, sibilance, mono incompatibilities, or some combination of the above.

The present invention is a device that allows complete control over how much a selected audio track(s) cuts through an audio mix. It maintains mono compatibility and creates few audible side effects unless used to the extreme. The present invention has applications not only in all forms of recorded and live music but can be adapted to film/video work (i.e. bringing out a dialogue audio track over a music or ambient background audio track). The present invention is also useful in disk jockey type applications where the disk jockey needs to cut through a loud music audio mix or a commercial music audio mix where every word of the vocal audio track must be understood. The present invention can be used in conjunction with most signal processing devices such as compressors, exciters, etc., while not degrading their performance. The present invention can be formed of hardware including digital signal processing components or analog signal processing components. More importantly, the present invention is not limited to implementation in hardware only, for all of the major components previously described may be readily implemented in software on commercially available computers or embedded signal processors provided the input audio mix is in digital form. This is readily accomplished through use of commercially available analog to digital circuitry serving as a preprocessor to the present invention.

The theory of operation of the present invention is summarized. Again, the primary audio track is defined as any audio track or audio tracks that need to be brought out in an audio mix. The primary audio track can be a lead vocal, a sub-mix of all vocals, dialogue, or any audio track of interest. The secondary audio track of an audio mix is defined as all audio tracks except the primary audio track. The primary audio track and the secondary audio track can be formed of low, high, and mid-frequency components.

The present invention has two stereo input pairs denoted as left and right primary inputs. The primary inputs receive the signals from the primary audio track. The present invention also has left and right secondary inputs which receive signals from the secondary audio track. There is one stereo output pair. Effects related to the primary audio track such as echo, reverb, processing, etc. can be routed into the present invention utilizing either the primary audio track(s) or secondary audio track depending on the effect desired and the setup.

Extreme high and low frequency signals coming into the secondary inputs are sent directly to the output. The remaining mid-frequency signals of the secondary audio track are sent to a number of frequency selective gain reduction amplifiers tuned to consecutive mid-frequency bands. The amount of gain reduction in each amplifier is controlled by a gain control signal voltage produced by an associated root mean square (RMS) detector in the primary input circuit tuned to the same frequency band. This control voltage is proportionate to the RMS voltage value within its bandpass of the detector activation signal that the RMS detector sees. The outputs of the different gain reduction amplifiers are combined and sent to one or more output summing amplifiers. Optionally, the unprocessed primary audio track is combined at this point with the processed secondary audio tracks.

When energy is detected in a given band in the primary audio track, a control voltage that is proportionate to that energy is generated by the RMS detector circuitry tuned to that band. This voltage causes a proportional amount of gain reduction in the same frequency band in the secondary audio track. Thus, the secondary audio track's overall mid-range frequency response will dynamically mold itself around the primary audio track.

The present invention incorporates a plurality bands of gain reduction covering four or five octaves in the mid-frequency range. In the preferred embodiment, six or more bands are utilized. The optimum number and width of the bands will be the number necessary to insure nearly transparent gain reduction in the secondary audio track. Too few bands will result in bands that are too wide causing audible pumping effects similar to full band width devices. Too many bands will result in diminishing returns, a longer signal path and higher cost. Extreme low and high frequencies are passed unaffected to maintain a consistent low and high end, thus helping to insure the transparent operation of the present invention. Design of filter stages should maintain as close to perfect phase and overall frequency response as possible with and without gain reduction occurring. The present invention allows a user to bring a primary audio track out of even the loudest and most dense background secondary audio track without a noticeable effect on the secondary audio track.

An advantage that the present invention has over existing mixing processors is that it appreciably reduces "pumping". "Pumping" is the audible modulation of a signal by other signals not in the same frequency range. An example is a bass drum consisting of mainly low frequencies triggering full band width gain reduction in a compressor processing a stereo audio mix. Every time the bass drum plays, it causes noticeable volume changes in all other instruments. Compared to conventional full band width compressors, limiters, or duckers, there are significantly less audible pumping effects produced by this system. Less audible effects are produced because gain reduction occurs in relatively narrow frequency bands in the secondary audio track and gain reduction in each band is masked by program in the same band in the primary channel. Also, the low and high frequencies of the secondary audio track and all frequencies of the primary audio track are unaffected. Relatively fast attack/decay times can be used in the gain reduction sections because of the masking effect described above. A large amount of transparent, mid-band gain reduction in the secondary audio track is possible.

Figure 2:
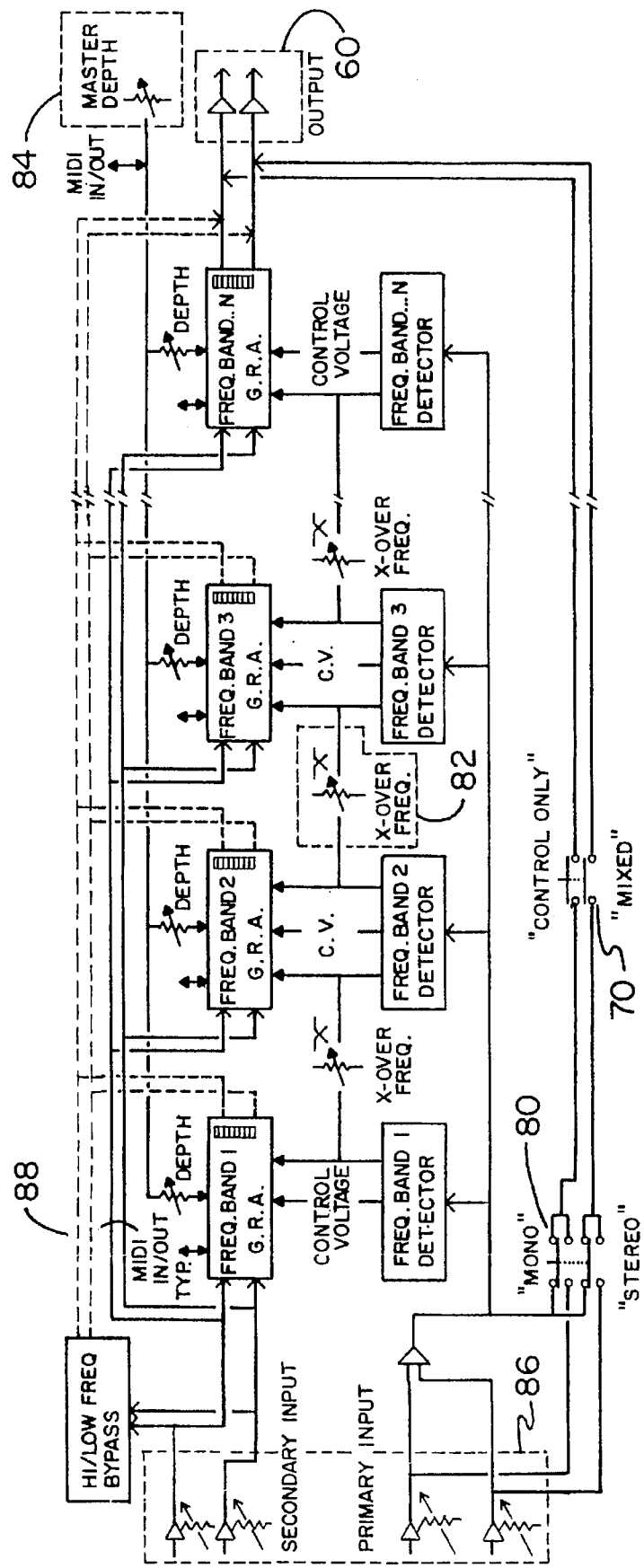
FIG. 2 is a functional block diagram of an alternate embodiment of the present invention.
Figure 3:
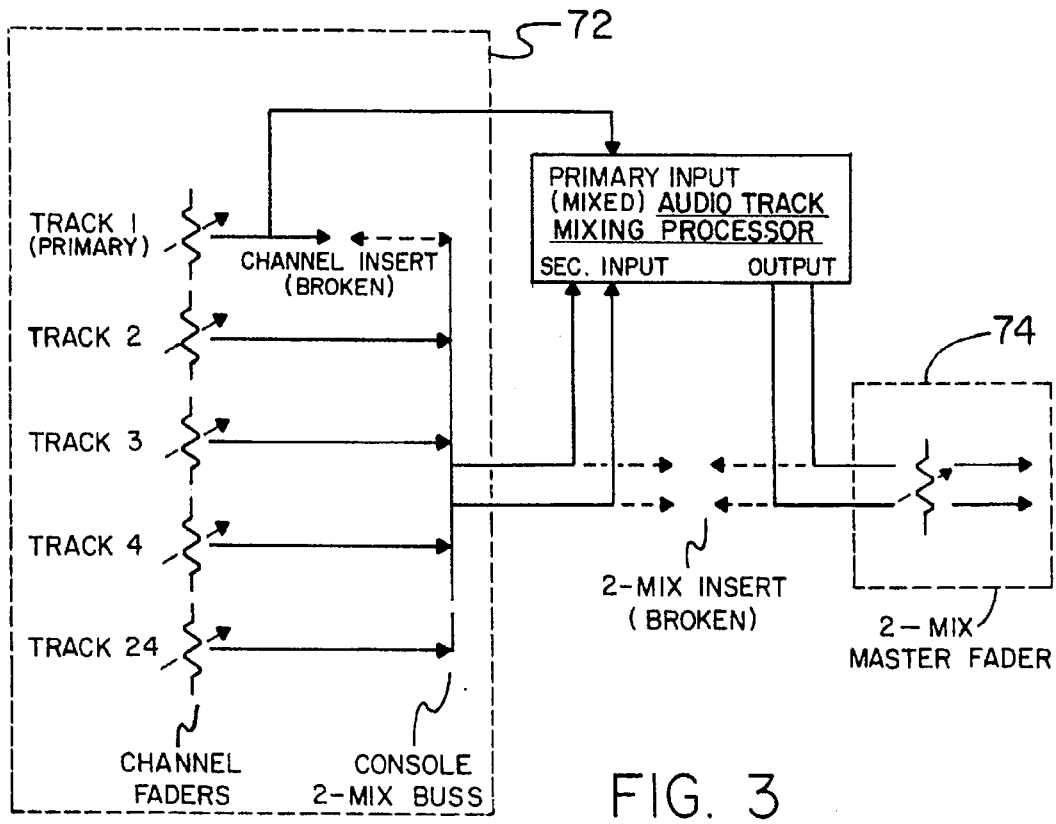
FIG. 3 depicts a typical "mixed" setup utilizing the present invention.
Figure 4:
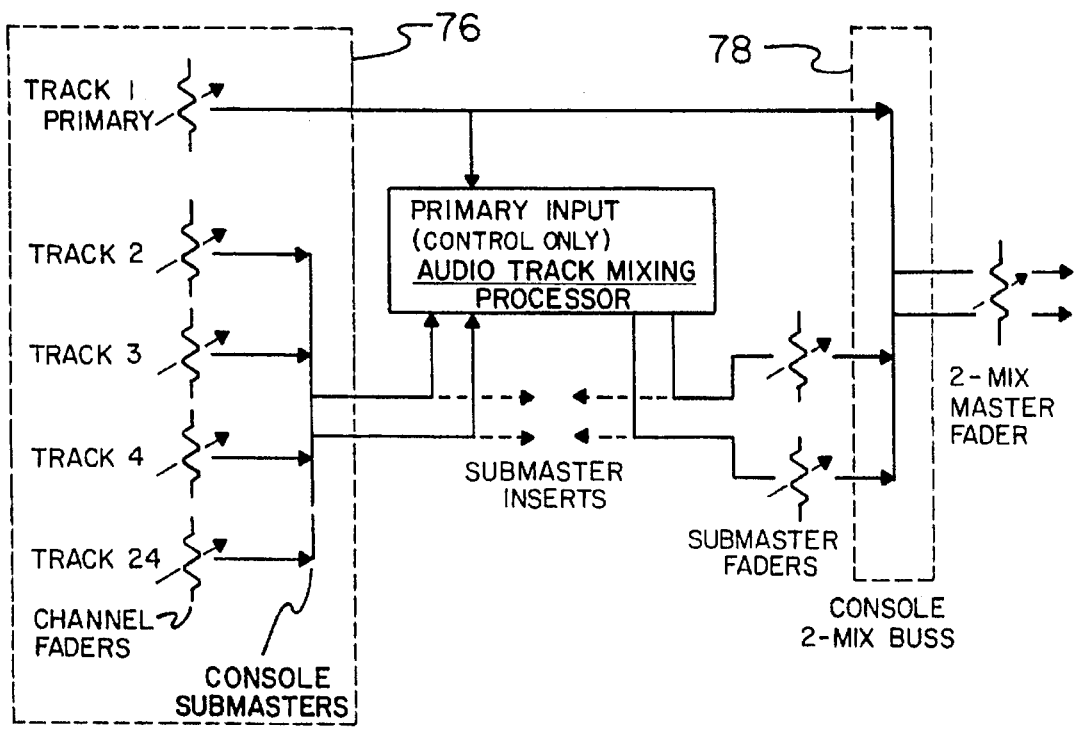
FIG. 4 depicts a typical "control-only" setup utilizing the present invention.

A second embodiment of the present invention is shown in FIG. 2 and includes substantially all of the components of the present invention further including several options to enhance overall operations. Most of these options are shown in FIG. 2. A "mixed/control only" switch 70 is used to determine if the primary audio track is mixed into the output audio mix or functions only as a control signal. The "mixed" position is used when the present invention is inserted into a mixer signal path 72 just before the final stereo fader 74. See FIG. 3. The "insert out" is patched to the secondary inputs and outputs of the device and are sent to the "insert in" patch points. The normal path from the primary audio track fader to the 2-mix is broken and the signal is routed directly to the primary input of the present invention. The primary and secondary audio tracks are combined internally in the device. This allows the present invention to be used with "in-line" mixers that don't have submaster buses. The "control only" position is used when the present invention is inserted into a sub-mix of secondary audio tracks 76 as shown in FIG. 4. A transmission from the primary audio track is sent to the primary input and is used only as a control signal. In this position, only the secondary audio track appears at the output of the device. Primary audio tracks and secondary audio tracks are then combined after the present invention in the console mix bus 78.

Referring again to FIG. 2, a "stereo/mono" input switch 80 is used to determine if the primary inputs remain stereo or are summed to mono before being sent to the stereo output. This is useful where a single mono primary audio track is being used in the "mixed" mode, allowing it to appear at both outputs. Individual "depth" 83 and "crossover frequency" controls 82 are used to determine secondary audio track gain reduction characteristics and bandpassed frequencies while a master gain 84 controls the overall gain reduction of all bands. Input level controls 86 are used to vary the sensitivity of primary and secondary channel inputs. An external MIDI (MIDI is an acronym for Musical Instrument Digital Interface, a standard for sending information between electronic music devices and computers) interface 88 and circuitry is added for receiving MIDI input controller messages for controlling overall and/or individual stage gain reduction depth. MIDI output controller messages are transmitted for reflecting the current state of each gain reduction section and can be edited in any sequencer program. This is useful for tweaking problem areas in an output audio mix. Front panel controls may be incorporated with MIDI components to change selection of frequency and gain setups. LED metering of gain reduction in each band plus input/output level metering may also be included.

As to the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and the manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modification and changes will readily occur to those skilled in the art, it is not desired to limit the invention to the exact construction and operation shown and described, and accordingly, all suitable modification and equivalents may be resorted to, falling within the scope of the invention.

What is claimed as being new and desired to be protected by Letters Patent of the United States is as follows:

1. An audio track mixing processor for creating a spectral diminution of a plurality of audio tracks in an input audio mix with respect to a selected audio track of the input audio mix, wherein the selected audio track within the input audio mix is designated as a primary audio track and the remaining audio tracks within the input audio mix are designated as a secondary audio track and a modified secondary audio track, wherein each audio track is formed of relative high frequency and mid-frequency and low frequency signals, comprising, in combination:

phonic conversion circuitry having a primary stereo input pair and a mono output port with the primary stereo pair including a left primary input and a right primary input for receiving a primary audio track in stereo and with the output port transmitting a detector activation signal in mono;

a plurality of consecutive tuned root mean square detectors, each root mean square detector having an input port and an output port, each input port coupled to the output port of the phonic conversion circuitry for receiving the detector activation signal therefrom, each output port of each root mean square detector transmitting a gain control signal at a value proportional to the root mean square value within its bandpass of the detector activation signal received at its input port;

a plurality of gain reduction amplifiers formed with bandpass filters tuned to a plurality of consecutive mid-frequency bands, each gain reduction amplifier tuned to a different mid-frequency band of the plurality of consecutive mid-frequency bands, each gain reduction amplifier associated with one of the plurality of root mean square detectors that is tuned to the same mid-frequency band, each gain reduction amplifier having a secondary stereo input pair, an input port, and an output pair, each secondary stereo input pair including a left secondary input and a right secondary input for receiving a secondary audio track, each input port coupled to the output port of the associated root mean square detector for receiving the gain control signal therefrom, and each output pair transmitting a secondary audio track with its mid-frequency signals modified by a gain that is based upon the value of the gain control signal received at the input port to thereby define a first modified secondary audio track;

a bypass filter formed of a stop band filter and having a bypass secondary stereo input pair and an bypass secondary stereo output pair with the bypass secondary stereo input pair including a left bypass secondary input and a right bypass secondary input for receiving a secondary audio track and with the bypass secondary stereo output pair transmitting a secondary bypass audio track containing only extreme high frequency and low frequency signals not transmitted by the gain reduction amplifiers to thereby define a second modified secondary audio track; and summation circuitry having an input pair and a stereo output pair with the input pair coupled with the primary stereo input pair for receiving the primary audio track therefrom, coupled to the output pairs of the gain reduction amplifiers for receiving the plurality of first modified secondary audio tracks therefrom, and coupled to the output pair of the bypass filter for receiving the second modified secondary audio track therefrom, and with the stereo output pair transmitting a summed result of the primary audio track, the first modified secondary audio tracks, and the second modified secondary audio track to thereby define an output audio mix having a primary audio track and a secondary audio track wherein the secondary audio track of the output audio mix is dependent on the primary audio track thereof.

2. An audio track mixing processor for creating a spectral diminution of a plurality of audio tracks in an input audio mix with respect to a selected audio track of the input audio mix, wherein the selected audio track is designated as the primary audio track and the remaining audio tracks are designated as a secondary audio track a modified secondary audio track, and wherein each audio track is formed of relative high, mid, and low frequency signals, comprising:

phonic conversion circuitry for receiving a primary audio track in stereo and transmitting a detector activation signal in mono;

a plurality of tuned root mean square detectors each receiving the detector activation signal and each transmitting a gain control signal based upon the detector activation signal;

a plurality of gain reduction amplifiers each associated with a root mean square detector, each receiving a secondary audio track and the gain control signal, and each transmitting a first modified secondary audio track with modified mid-frequency signals based upon the gain control signal;

a bypass filter for receiving a secondary audio track and transmitting a second modified secondary audio track containing only high frequency and low frequency signals not transmitted by the gain reduction amplifiers; and summation circuitry for receiving the primary audio track, the first modified secondary audio track and the second modified secondary audio track and transmitting a summed result thereof as an output audio mix.

3. The audio track mixing processor as set forth in claim 2 further including switch means having one orientation for allowing the primary audio track to summed into the output audio mix and another orientation for preventing the primary audio track from being summed into the audio mix.

4. The audio track mixing processor as set forth in claim 2 further including switch means having one orientation for transmitting the primary audio track to the summation circuitry in stereo and another orientation for transmitting the primary audio track in mono.

5. The audio track mixing processor as set forth in claim 2 further including depth and crossover frequency control means for controlling the gain control signal and frequency coverage of the gain reduction amplifiers.

6. The audio track mixing processor as set forth in claim 2 further including master depth control means for controlling the overall gain of the primary audio track, the secondary audio track and secondary audio track.

7. The audio track mixing processor as set forth in claim 2 further including input level control means for varying the sensitivity of the input audio mix.

8. The audio track mixing processor as set forth in claim 2 further including monitoring means coupled to each of the gain reduction amplifiers for monitoring the status of operation thereof.

* * * * *